METHOD OF MANUFACTURING SEMICONDUCTOR DEVICES

Filed March 16, 1964

INVENTOR.
ALLEN GEE,
BY Charles S. Haughey
ATTORNEY.

United States Patent Office 3,323,956

Patented June 6, 1967

3,323,956

METHOD OF MANUFACTURING SEMICONDUCTOR DEVICES

Allen Gee, Newport Beach, Calif., assignor to Hughes Aircraft Company, Culver City, Calif., a corporation of Delaware Filed Mar. 16, 1964, Ser. No. 352,149

7 Claims. (Cl. 148—177)

This invention relates to glass passivated semiconductor devices, and is particularly advantageous in connection with devices of the planar type having rectifying junction forming regions adjacent a planar surface and an electrically insulative film overlying the edge of the rectifying junction at the planar surface.

In some semiconductor devices a rectifying junction forming region is provided in a semiconductor body by alloying into the body a conductivity type determining impurity element or alloy which, upon recrystalization, forms within the crystal a region of conductivity type opposite to that of the body of the crystal. It may be convenient to make electrical connection to the new-formed region by attaching a wire or conductive lead to the alloy which formed the region. It will, however, be necessary to remove, as by etching, the alloy metal adjacent the junction edge to avoid possible short-circuit of the junction around its edge at the surface. In certain semiconductor devices of the planar type either the surface adjacent junction forming region is formed by a diffusion process which does not produce a button, or protruding body, of alloy for easy attachment of an electrical lead; or, if an alloy is initially used it is removed as by etching to leave a residual planar surface. However formed, it is characteristic of planar junction devices that regions of opposite electrical conductivity type form a P–N junction extending to a planar surface, and it has been found to be highly desirable to passivate the planar surface about the junction area.

Passivation by silicon oxide films, such as silicon dioxide formed by oxidation of a silicon surface or by vacuum vapor deposit or by thermal decomposition has been proposed, and is commonly used for masking steps during manufacture, as illustrated by U.S. patents to Noyce 2,981,877 and Hoerni 3,025,589. Such oxide films have inherent difficulties in that films may be too thin and are porous, or may be too thick and highly subject to cracking. In some cases both types of defects may be present.

Glass films have also been proposed for semiconductor surface coatings, as for example in U.S. patent to Derick and Frosch 2,802,760, where the glass was used as an impurity source for controlled diffusion of the impurity into the surface.

A combination of glass film over an oxide film has been proposed for passivation, or if glass without impurities were available, a glass film directly on the semiconductor material. It has been found that such structure, while solving most of the above problems, is commercially impractical due to great difficulty in making lead attachments to junction forming regions through the glass film and due to an at present unexplained degradation of device properties during application of the glass film and lead attachment.

The present invention solves the problem of device degradation and greatly simplifies lead attachment to eliminate or correct the difficulties cited and to produce a very rugged and stable device in a manner suitable for mass production at relatively low cost.

Other advantages and characteristics of this invention will become apparent from the description and explanation of the invention.

For consideration of what I believe to be novel and my invention, attention is directed to the following portion of this specification, including the drawings, which describes the invention and the manner and process of making and using it.

Figures 1, 2, 6:
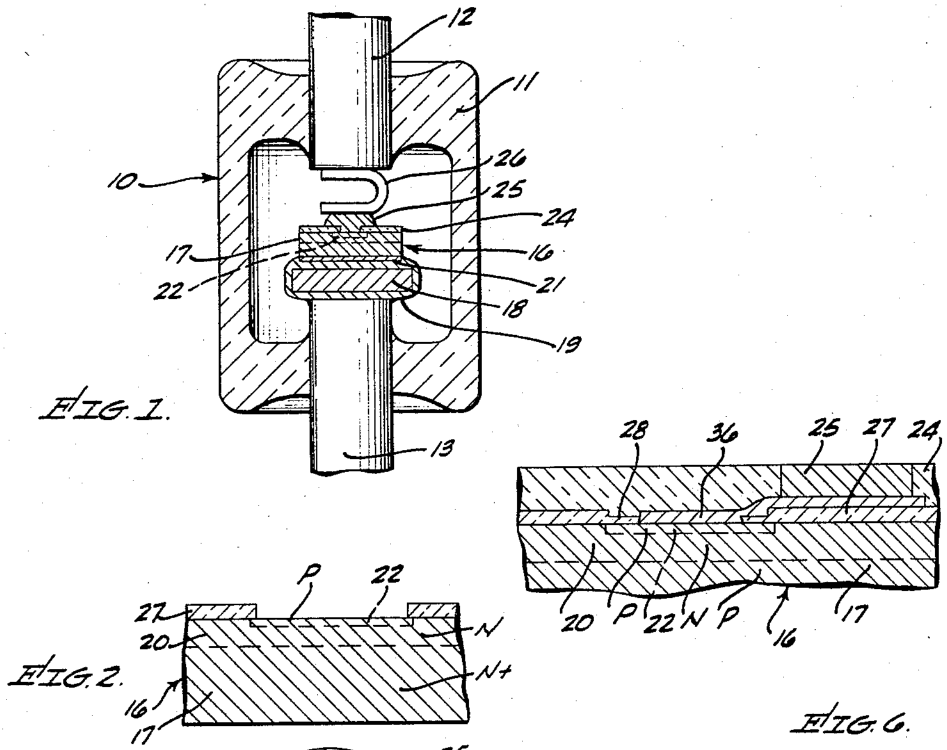
FIG. 1 is a cross-sectional elevational view of a semiconductor device, in a coaxial lead, tubular glass package, fabricated according to this invention.
FIGS. 2, 3 and 4 are cross-sectional elevational views of a portion of the device of FIG. 1 at successive steps during the fabrication thereof.
FIG. 6 is an alternate device 16 configuration preferred for transistor contacts.

According to the present invention, as illustrated in the drawing, a glass film is formed on a semiconductor device, such as a silicon diode die, preferably over an intermediate oxide layer which complements the glass film to form a surface seal, and to form a metal lead contact through the glass film to the device, a metal layer which on silicon is preferably silver silicon alloy, is formed on the die before the glass layer is formed, and an aperture in the glass is made over the metal layer to expose the metal for lead attachment. To restore electrical properties degraded by application of the glass film, the die is then baked at a temperature below the glass softening temperature but high enough to cure the degraded properties. For silicon, a temperature from 325° C. to 550° C. is preferred.

The device illustrated in FIG. 1 comprises a semiconductor diode device 16 in a conventional glass coaxial lead package 10 comprising coaxial leads 12 and 13 extending from a tubular glass envelope 11 and hermetically sealed thereto. The diode device 16 may be mounted within the coaxial glass package in any suitable manner as is common in the art. As illustrated, the device 16 comprises a semiconductor crystal die 17 having a metallic button contact 25 on one side thereof electrically connected to lead 12 through a C-shape whisker 26. The reverse side of the crystal die 17 is ohmically connected to a copper plate 18 which in turn is ohmically connected to lead 13.

Although the semiconductor diode device 16 is illustrated in FIG. 1 as encapsulated in a standard hermetically sealed coaxial glass package, as subsequently appears the device 16 contains within its structure an adequate protective seal against ambient conditions, and is therefore further sealed by the coaxial glass package for convenience in handling and improved yield and reliability.

Figure 3:
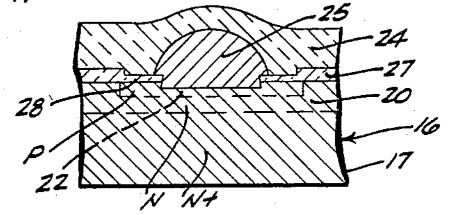

As illustrated in greater detail in FIGS. 2, 3 and 4, the semiconductor diode device 16 may be produced, by way of illustration, in the following preferred process.

A semiconductor crystal slice or die 17 is prepared, which for this example shall be silicon of N+ conductivity type of perhaps .005 to .010 ohm centimeters resistance, and having a total thickness of the order of 6 mils. An epitaxial layer 20 is grown on the surface of the die 17, the layer 20 being of N-type and may be of the order of 1 to 10 ohm centimeters resistivity. While a single device die is illustrated, it is to be understood that there will customarily be several hundred devices produced simultaneously on a given crystal slice, to be subsequently separated into individual device dice. In fabricating a silicon semiconductor diode according to this invention, the die 17 is covered with a silicon dioxide film suitable for masking in an impurity diffusion process. As shown in FIG. 2, a silicon dioxide film 27 of about 1 to 2 microns thickness is grown over the epitaxial layer 20 as by exposure at about 1,000° C. for 16 hours to an ambient atmosphere of steam and argon gas. The oxide film 27 has an opening or window therein which may be produced by a photochemical masking and subsequent etching process such as illustrated in U.S. Patents 2,981,-877 to Noyce and 3,025,589 to Hoerni. After forming the opening in the oxide film 27, a P-type conductivity type determining impurity is diffused through the opening and into the epitaxial layer 20 of the crystal to convert a region thereof 22 adjacent the opening to P-type. The process is illustrated in said Hoerni patent and U.S. Patent 2,802,760 to Derick and Frosch. Alternatively, for purpose of this invention, an impurity type determining material could be alloyed into the crystal through the opening in film 27 to form a region 22 of P-type, after which the excess alloy could be removed, as by selective etching, to produce a substantially planar surface on the crystal 17. After formation of P-type region 22, the opening in the film 27 is closed by the formation of a second oxide film, which may be by the same process as that used to form the first film 27; or the diffusion steps to produce region 22 may be done in an oxidizing atmosphere to simultaneously grow the oxide film 28. The films 27 and 28 may be indistinguishable except for thickness. A second opening is made in the regrown film 28 within the area of the original opening whereby to leave a portion of the new film 28 extending over the P-N junction from between the P-type region 22 and the adjacent portion of the epitaxial layer 20. The second opening may be formed by a photochemical etching process such as was used to form the original window. By extending the oxide film 28 beyond the opening used to form the region 22, improved device properties and better yield are obtained.

An electrical contact metal such as silver is next deposited within the area of the second opening in the oxide film by any suitable process, such as by alloy plating as is well-known in the art. For example, an alloy plating solution may be placed upon an absorbent pad such as cotton wadding wrapped around an electrically conductive core such as carbon and contacted to the P-type region through the opening in the oxide film mask 27, 28 and the opposite electrode of the electro plating system is contacted to the reverse side, or N-type portion, of the crystal die 17. Plating is allowed to proceed until a substantial deposit of metal has been produced, preferably exceeding the thickness of the film 27 several times to produce a bump 25 extending substantially above the oxide film. If desirable a second metal such as gold or an "impurity," may be plated on the silicon crystal before or simultaneously with the metal forming most of the bump for improved electrical properties, adhesion of the metal to the crystal, or to facilitate wetting in subsequent alloy bonding.

The deposited bump 25 is preferably of the order of ½ mil thickness, or about 12 microns, as compared to about 1 to 2 microns thickness of the oxide film. A layer of glass frit composed of glass particles, preferably substantially less than about 10 microns in diameter, is next coated upon a surface of the crystal. The glass composition is selected for thermal expansion characteristics matching those of the crystal and for insulating qualities. For silicon crystal material a boro-silicate glass is quite suitable. A glass sold under the identification of Corning 7040 by Corning Glass Works has thermal expansion characteristics matching very closely those of silicon semiconductor material and may be used in the step. The glass may be applied as a frit by coating the crystal with a suspension of the frit in methanol, in a centrifuge. The coated die, or slice, is next subjected to a sintering operation during which the glass film is fused to the oxide film to form a film 24 predominately of glass, of the order of ½ mil or 12 microns thickness. The sintering in this example may be at about 850° C. for about 5 minutes during which the deposited silver bump 25 will also fuse and may alloy slightly into the P-type region 22 of the crystal. It will also form a rounded, button shape over the edge of the oxide film and will produce a bump under the glass film 24, causing the film to be thinner over the bump 25. The sintering temperature has been chosen below the silver melting point but above the silver-silicon eutectic temperature to produce a controlled penetration of the crystal and a suitable fusing of the glass and button between the glass and silver. The phase diagram for silver-silicon, as shown in Hanson, Constitution of Binary Alloys, second edition, published by McGraw-Hill Book Company, Inc., 1958, on page 51, has a silver-silicon eutectic temperature of 830° C. at about 4.5% by weight silicon, and a silver melting point of 950° C. Between 830° C. and 950° C. the solubility curve on the high silicon side is nearly vertical, so that solubility of silicon in the silver hardly increases with temperature. Thus penetration of the silver-silicon alloy into the crystal is very small and depends more on the volume of silver deposited than on the temperature of alloy bonding. This silver volume is preferably kept very small, but is large enough to form a button above the oxide film to assist in opening the glass layer for subsequent lead attachment. An opening is next produced in the thin portion of the glass film 24 to expose a portion of the silver bump 25, as by photochemical etching processes. An additional volume of silver is then plated over and onto the silver bump 25 to substantially extend the volume of the silver bump to form an enlarged silver metal button contact 25 as is shown in FIG. 4, giving a large silver button contact without the disadvantage of fusing it into the crystal.

The semiconductor die as illustrated above may have a reliable back voltage of the order of 70 volts before the glass film forming step. The back voltage of the device is unpredictably and seriously deteriorated, often to a back voltage of 5 or 10 volts, and other electrical characteristics are similarly unpredictably affected during the glass film forming and additional silver plating steps in the process. A heat treatment has been devised which restores the original characteristics of the diode permanently and reliably by subjecting the diode assembly of FIG. 4 to a heating or annealing treatment at a temperature below the glass softening temperature, which may be of the order of 475 to 490° C. for about 10 minutes, or about 325° for about 24 hours, or up to about 550° for less than 5 minutes. Such treatment permanently restores the 70 v. back voltage. The heat treatment may be effected by reheating the die or may alternatively be effected by cooling slowly through the tempering region of 350 to 550° C. after the glass annealing step. It would appear that an inverse relation exists between the temperature required for the heating treatment and the time at temperature. When the temperature in excess of 550° C. is used for the herein described silicon semiconductor diode, a degradation of device properties may be encountered. These temperatures and times will of course vary with materials, as when other glass is used.

The cause of the eratic degradation above described, and the mechanism by which it is removed and the original properties recovered in the heat treatment, is not presently fully understood. It may be related to strains imposed by the glass film upon the crystal adjacent the P-N junction, or to surface film defects, which strains or defects are removed by an annealing mechanism; but no theory to explain the phenomona is proposed here as a correct understanding of what has been discovered.

Figure 4:
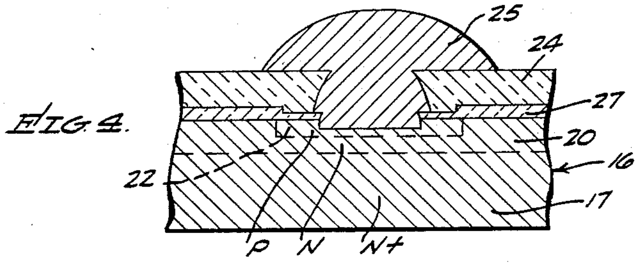

After the diode device 16 of FIG. 4 has been produced, it may be assembled into a circuit by attaching suitable leads to the button 25 connected to the P-type region 22 and to the back side of the die 17 in contact with the N-type region. Such connections are conveniently illustrated in FIG. 1 wherein the diode 16 is alloy bonded to a tin clad copper plate 18 by a tin copper silicon alloy generally formed by heating a tin coated copper plate in contact with a silicon die to form a tin copper silicon solder alloy 21. A copper tin alloy 19 is formed by bonding the copper plate 18 to the lead 13. A C-shaped platinum alloy element 27 attached to lead 12 contacts the button 25 and may either be spring biased in contact therewith, or may be alloyed thereto. Such alloying is commonly done by an electrical pulse passed through the assembly after sealing the diode device 16 into the coaxial tubular glass package 10.

Figure 5:
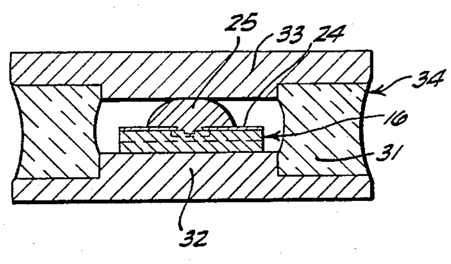
FIG. 5 is a cross-sectional elevational view of the device of FIG. 1 in an alternate package.

An alternate flat package 34 is illustrated in FIG. 5 in which a pair of end plates 33 and 32, preferably of a metal such as nickel-iron having thermal expansion characteristics substantially matching those of the silicon die, form the top and bottom metal electrical contacts for the package. A ring 31 of glass material surrounds the diode 16 and is bonded to the end plates to form a hermetically sealed flat package. The bond of the glass to the end plates 32 and 33, as well as the bond of the silicon device 16 and the surface bump 25 to the end plates, is facilitated by a metal film or coating of silver on the end plates. The silver plate on the end plates facilitates the metal to glass bond and the alloy bond to the diode 16.

The device exampled above is a diode device in which the thickness of the region 22, which may be regrown or diffused, is not critical. The silver-silicon alloy bond of the button 25 to the crystal 22 may be allowed to penetrate the crystal a controlled depth. Transistor devices, and especially diffused emitter and base structures, may be more critical and require avoidance of such penetration. In such cases an alternate technique is used for forming the metal contact button. The process explained with FIGS. 3, 4 and 5 is used except that after the second opening in the oxide film is formed, a mask is formed by photoetch techniques and a metal film lead is deposited over the opening and a portion of the oxide film to a remote area, or land, at which the button of silver will be produced. The silver is then deposited, through a suitable mask, on the land, and the glass film is formed as before. The resulting product is shown in part in FIG. 6, using similar numbers to denote similar areas or elements to those of FIGS. 2–4. The die 17 has an emitter region 22, an oxide film 27, 28, and a glass film 24. A metal film 36 connects region 22 to a silver button 25, which may be enlarged by plating as in FIG. 4 for further assembly.

Although the above example is illustrated for silicon, other semiconductor materials may be used and certain techniques, materials and conditions adjusted accordingly. For example, for germanium devices the oxide films may be evaporated silicon dioxide, produced by vacuum evaporation of quartz on tungsten filaments to deposit the $SiO_2$ film on the germanium surface. The metal button may be a dopant metal or alloy such as indium or gold-gallium. The glass for the frit would be a lower melting glass having thermal expansion matching germanium, and the contact through the glass would be made in the same manner.

What is claimed is:

1. A method of manufacturing a silicon semi-conductor device which comprises:

(a) forming an oxide film on a surface of a semiconductor silicon wafer of one conductivity type;
(b) forming an opening in the film;
(c) diffusing an impurity of opposite conductivity type into the wafer through the opening to form adjacent the opening a region of said opposite conductivity type forming with the adjacent portion of the wafer a P–N junction;
(d) forming a second oxide film on said surface and extending over said first opening area;
(e) forming a second opening within and spaced from the edges of the first opening, leaving a portion of the oxide film covering the P–N junction and the regions immediately adjacent;
(f) depositing silver within the second opening to form a first metal contact to the wafer through the second opening;
(g) heating to above 830° C. to fuse the silver to the silicon and the oxide;
(h) forming a film of glass on and adherent to the oxide film by deposit of a layer of glass frit thereon and fusing said layer to form an adherent film of glass;
(i) forming an opening in the glass film over the metal contact to expose the metal;
(j) depositing additional silver over the first silver contact, in the opening in the glass, and
(k) baking the wafer between about 325° C. and 550° C. to restore device junction properties which were degraded in previous manufacturing steps.

2. A method of manufacturing a silicon semiconductor device which comprises:

(a) forming an oxide film on a surface of a semiconductor silicon wafer of one conductivity type;
(b) forming an opening in the film;
(c) diffusing an impurity of opposite conductivity type into the wafer through the opening to form adjacent the opening a region of said opposite conductivity type forming with the adjacent portion of the wafer a P–N junction;
(d) forming a second oxide film on said surface and extending over said first opening area;
(e) forming a second opening within and spaced from the edges of the first opening, leaving a portion of the oxide film covering the P–N junction and the regions immediately adjacent;
(f) forming a first metal contact to the wafer through the second opening;
(g) forming a film of glass on and adherent to the oxide film by deposit of a layer of glass frit thereon and fusing said layer to form an adherent film of glass;
(h) forming an opening in the glass film over the metal contact to expose the metal;
(i) attaching a second metal contact to the first metal contact; and
(j) baking the wafer between about 325° C. and 550° C. to restore device junction properties which were degraded in previous manufacturing steps.

3. A method of manufacturing a silicon semiconductor device which comprises:

(a) forming an oxide film on a surface of a semiconductor silicon wafer predominantly of one conductivity type and having adjacent a portion of the surface a region of said opposite conductivity type forming with the adjacent portion of the wafer a P–N junction, a portion of the oxide film covering the P–N junction adjacent said region;
(b) forming a film of glass on and adherent to the oxide film by deposit of a layer of glass frit thereon and fusing said layer to form an adherent film of glass;
(c) attaching a metal contact to said region; and
(d) baking the wafer between about 325° C. and 550° to restore device junction properties which were degraded in previous manufacturing steps.

4. A method of manufacturing a semiconductor device, which comprises:

(a) forming a film of glass on and adherent to a surface of the device;
(b) forming a metal contact to the device through the glass film; and
(c) baking the wafer below the glass softening temperature to restore device properties which were degraded in the previous manufacturing steps.

5. A method of manufacturing a semiconductor device which comprises:

(a) forming an oxide film on a surface of a semiconductor wafer predominantly of one conductivity type and having adjacent a portion of the surface a region of opposite conductivity type forming with the adjacent portion of the wafer a P–N junction, a portion of the oxide film covering the P–N junction adjacent said region;

(b) forming a film of glass on and adherent to the oxide film by deposit of a layer of glass frit thereon and fusing said layer to form an adherent film of glass;

(c) attaching a metal contact to said region; and (d) baking the wafer below glass softening temperature to restore junction properties which were degraded in previous manufacturing steps.

6. A method of manufacturing a silicon semiconductor device which comprises:

(a) forming an oxide film on a surface of a semiconductor silicon wafer of one conductivity type;

(b) forming an opening in the film;

(c) diffusing an impurity of opposite conductivity type into the wafer through the opening to form adjacent the opening a region of said opposite conductivity type forming with the adjacent portion of the wafer a P–N junction;

(d) forming a second oxide film on said surface and extending over said first opening area;

(e) forming a second opening within and spaced from the edges of the first opening, leaving a portion of the oxide film covering the P–N junction and the regions immediately adjacent;

(f) depositing silver within the second opening substantially thicker than the oxide film to form a first metal contact to the wafer through the second opening;

(g) heating to fuse the silver to the silicon and the oxide;

(h) forming a film of glass on and adherent to the oxide film by deposit of a layer of glass frit thereon and fusing said layer to form an adherent film of glass;

(i) forming an opening in the thin portion of the glass film over the metal contact to expose the metal;

(j) depositing additional silver over the first silver contact, in the opening in the glass, and (k) baking the wafer between about 325° C. and 550° to restore device junction properties which were degraded in previous manufacturing steps.

7. A method of manufacturing a semiconductor device which comprises:

(a) forming, on a surface of a semiconductor wafer predominately of one conductivity type and having adjacent a portion of the surface a region of opposite conductivity type forming with the adjacent portion of the wafer a P–N junction, a film essentially of glass on and adherent to the semiconductor wafer surface;

(b) attaching a metal contact to one of said adjacent conductivity type regions through the film of glass; and (c) baking the wafer below the glass softening temperature to restore junction properties which were degraded in previous manufacturing steps.

References Cited

UNITED STATES PATENTS

| | | | |
|---|---|---|---|
| 2,913,358 | 11/1959 | Harrington et al. | 148—1.5 |
| 3,247,428 | 4/1966 | Perri et al. | 148—1.5 |

DAVID L. RECK, *Primary Examiner.*

R. O. DEAN, *Assistant Examiner.*